United States Patent [19]
Root

[11] Patent Number: 4,802,277
[45] Date of Patent: Feb. 7, 1989

[54] METHOD OF MAKING A CHIP CARRIER SLOTTED ARRAY

[75] Inventor: Randolph E. Root, Westminster, Calif.

[73] Assignee: Hughes Aircraft Company, Los Angeles, Calif.

[21] Appl. No.: 124,229

[22] Filed: Nov. 23, 1987

Related U.S. Application Data

[62] Division of Ser. No. 722,644, Apr. 12, 1985, abandoned.

[51] Int. Cl.⁴ .................. H01L 23/48; H05K 3/10
[52] U.S. Cl. ........................... 29/846; 29/850; 156/252; 156/257; 357/80
[58] Field of Search ............... 156/252, 257; 29/832, 29/846, 850; 357/70, 80

[56] References Cited

U.S. PATENT DOCUMENTS

| | | | |
|---|---|---|---|
| 3,924,746 | 12/1975 | Haines | 206/530 |
| 3,926,746 | 12/1975 | Hargis | 156/89 X |
| 3,941,248 | 11/1976 | Moser et al. | 206/531 |
| 4,357,192 | 11/1982 | Moser | 156/252 |
| 4,398,634 | 8/1983 | McClosky | 206/532 |
| 4,577,757 | 2/1986 | Spadafora | 156/252 X |
| 4,681,656 | 7/1987 | Byrum | 156/252 X |
| 4,700,473 | 10/1987 | Freyman et al. | 29/846 |

FOREIGN PATENT DOCUMENTS

| | | |
|---|---|---|
| 0051168 | 10/1981 | European Pat. Off. . |
| 0057253 | 8/1982 | European Pat. Off. . |
| 0113282 | 7/1984 | European Pat. Off. . |
| 0149923 | 7/1985 | European Pat. Off. . |
| 2360922 | 6/1974 | Fed. Rep. of Germany . |
| 2115607 | 9/1983 | United Kingdom . |

Primary Examiner—P. W. Echols
Assistant Examiner—Taylor J. Ross
Attorney, Agent, or Firm—Kenneth W. Float; A. W. Karambelas

[57] ABSTRACT

A method of making a chip carrier array including the steps of providing a ceramic substrate and forming elongated slots in the substrate which define the edges thereof and which form one severable interconnecting bridge at each edge of each chip carrier, which bridges maintain the individual chip carriers in the array. A plurality of edge interconnect conductors are formed along each edge portion of each chip carrier on either side of the interconnecting bridges.

21 Claims, 2 Drawing Sheets

METHOD OF MAKING A CHIP CARRIER SLOTTED ARRAY

CROSS REFERENCE TO RELATED APPLICATIONS

This application is a divisional of application Ser. No. 722,644, filed Apr. 12, 1985, now abandoned.

BACKGROUND OF THE INVENTION

The disclosed invention generally relates to mini chip carrier arrays, and is particularly directed to a mini chip carrier array wherein individual chip carriers are separated by elongated slots each of which accommodate a plurality of wrap-around edge interconnects for each adjacent chip carrier.

Integrated circuit chips utilized in complex hybrid circuits are often mounted on individual ceramic carriers. Typically, the ceramic carrier is bonded to the hybrid circuit motherboard by soldering the edge interconnects of the ceramic carrier to corresponding conductors on the motherboard.

Ceramic carriers are typically fabricated in unitary arrays wherein each chip carrier array includes a matrix of interconnected chip carriers. Each chip carrier includes a plurality of metallized wrap-around edge interconnects which pass through holes or slits formed along the boundaries between the individual chip carriers and along the chip carrier edges adjacent the substrate waste edge. In some arrays, each hole or slit between adjacent chip carriers accommodates two wrap-around edge interconnects, one from each adjacent chip carrier, while each hole or slit adjacent the substrate waste edge accommodates a single wrap-around edge interconnect for the adjacent chip carrier. In other arrays, a separate hole or slit is provided for each wrap around interconnect.

Typically, the wrap-around edge interconnects are applied by silk screen printing and vacuum pull-through techniques. For arrays having holes or slits between adjacent carriers for accommodating two edge interconnects, the edge interconnects are applied by shared metallization. However, in order to maintain electrical isolation between edge interconnects sharing the same hole or slit, the size of the hole or slit has to be sufficiently large to avoid a short circuit in the metallization process. Thus, the minimum spacing between edge interconnects of an individual chip carrier is limited by a minimum hole or slit size and the necessary spacing between adjacent holes or slits. Such limitation in turn limits the minimum chip carrier size.

The electrical isolation referred to above allows for electrical testing of the entire chip carrier array prior to separation of the array into individual chip carriers. Of course, if such testing is not necessary, then smaller holes or slits could be tolerated to achieve closer spacing of the edge interconnects. However, separation of the array into individual chip carriers could cause damage to the chip carriers having short circuited edge interconnects.

The arrays wherein each edge interconnect has its own hole or slit allows for closer spacing, but the minimum spacing is still limited since metallization within a hole or slit becomes more difficult as its size decreases. Moreover, the production of such a chip carrier array is more complex and expensive.

A further disadvantage of known chip carrier arrays is that corners of individual chip carriers randomly break when the array is separated into individual chip carriers. Such breaking typically damages edge interconnects, thereby rendering useless each chip carrier having a damaged conductor. To the extent that integrated circuit chips are mounted on the chip carriers prior to separation of the chip carrier array, a damaged chip carrier also results in a wasted integrated circuit.

Another disadvantage of known chip carrier arrays is the high cost of production resulting from (1) the necessary laser fabrication of numerous through holes or slits, (2) the difficulty of inspecting individual chip carriers, and/or (3) the reduced yield caused by breakage.

SUMMARY OF THE INVENTION

It would therefore be an advantage to provide a chip carrier array which allows for reduced minimum spacing between edge interconnects.

It would also be an advantage to provide a chip carrier array which provides for reduced minimum spacing between edge interconnects and reliable electrical isolation of the edge interconnects.

Another advantage would be to provide a chip carrier array which provides for reduced minimum spacing between edge interconnects and allows for electrical testing of the entire array with intergrated circuits mounted on the chip carriers.

Still another advantage would be to provide a chip carrier array which allows for separation of individual chip carriers with reduced breakage.

A further advantage would be to provide a chip carrier array which is easier to inspect visually.

It would also be an advantage to provide a chip carrier array which is less complex and less expensive to manufacture.

The foregoing and other advantages and purposes are provided by the invention which includes a chip carrier array having interconnected chip carriers separated from each other and from the substrate waste edge by elongated slots which define outer edges of the chip carriers. More particularly, each chip carrier includes corners which are defined by the elongated slots. Each chip carrier includes a plurality of electrically isolated edge interconnects which wrap around edges defined by the elongated slots.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION

Figure 1:
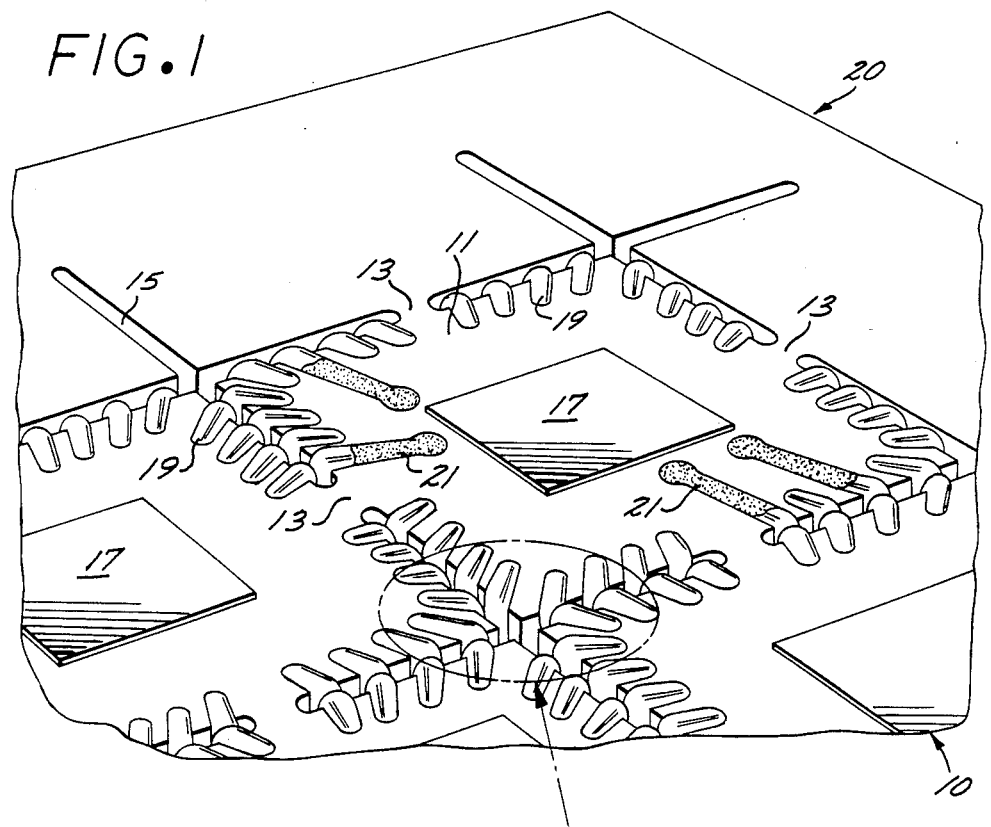
FIG. 1 is a perspective view of a section of a chip carrier array made in accordance with the invention.

In the following detailed description and in the several figures of the drawing, like elements are identified with like reference numerals.

Referring now to FIG. 1, shown therein is a perspective view of a section of the chip carrier array 10 of the invention which is formed on a ceramic substrate 20. The chip carrier array 10 includes a plurality of chip carriers 11 which are interconnected to each other and to the substrate waste edge (shown in FIG. 4) by a plurality of support bridges 13. The chip carriers 11 are separated from each other and from the substrate waste edge by elongated slots 15 which extend from the support bridges 13 beyond each corner of an adjacent chip carrier 11.

Figure 2:
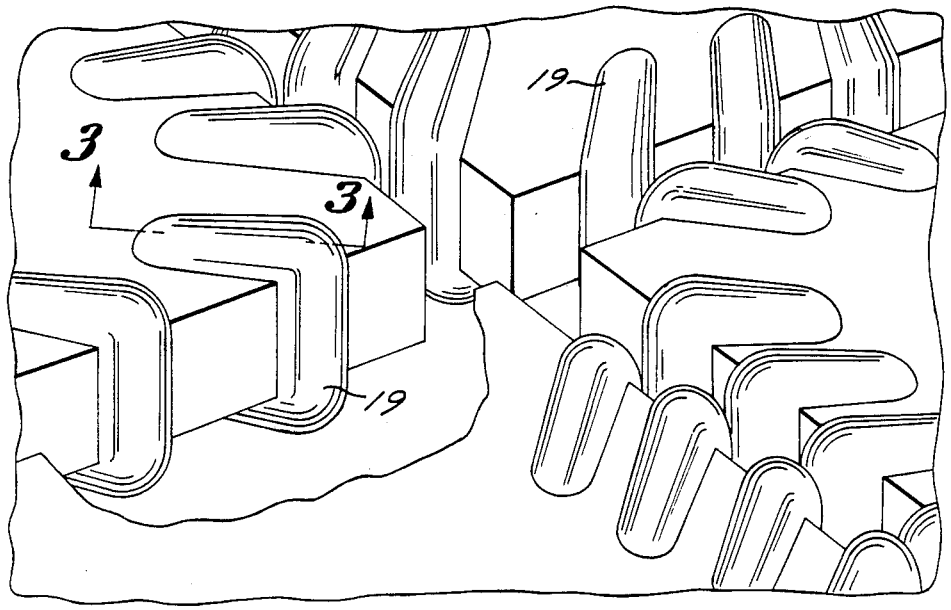
FIG. 2 is a detailed partial perspective view of four adjacent chip carriers of the chip carrier array section of FIG. 1.
Figure 3:
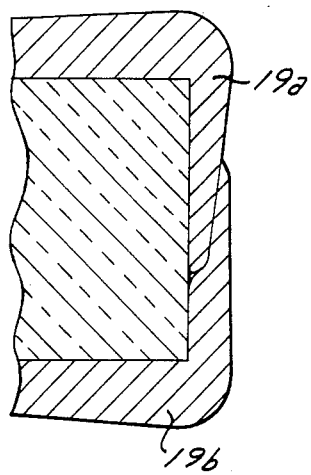
FIG. 3 is a cross-sectional view through an edge interconnect of the chip carrier of the invention.

Each chip carrier 11 includes a centrally located die pad 17 for accepting an integrated circuit chip (not shown). As is well kwown, the die pad 17 is a conductive region which may be formed by thick film metallization. Each chip carrier 11 further includes a plurality of metallized edge interconnects 19 which wrap around the edges defined by the elongated slots 15. As particularly shown in FIGS. 2 and 3, each edge interconnect 19 extends slightly on the top and bottom surfaces of its associated chip carrier 11. By way of example, the edge interconnects 19 are metallized by silk screen printing and vacuum pull through techniques.

A metallized wire bond interconnect 21 is conductively attached to each edge interconnect 19. For ease of reference, only a few wire bond interconnects 21 are shown. As is well known, an integrated circuit chip is mounted to each chip carrier 11 over the die pad 17. Wire bond connections (not shown) are then made between the integrated circuit leads and the wire bond interconnects 21.

Figure 4:
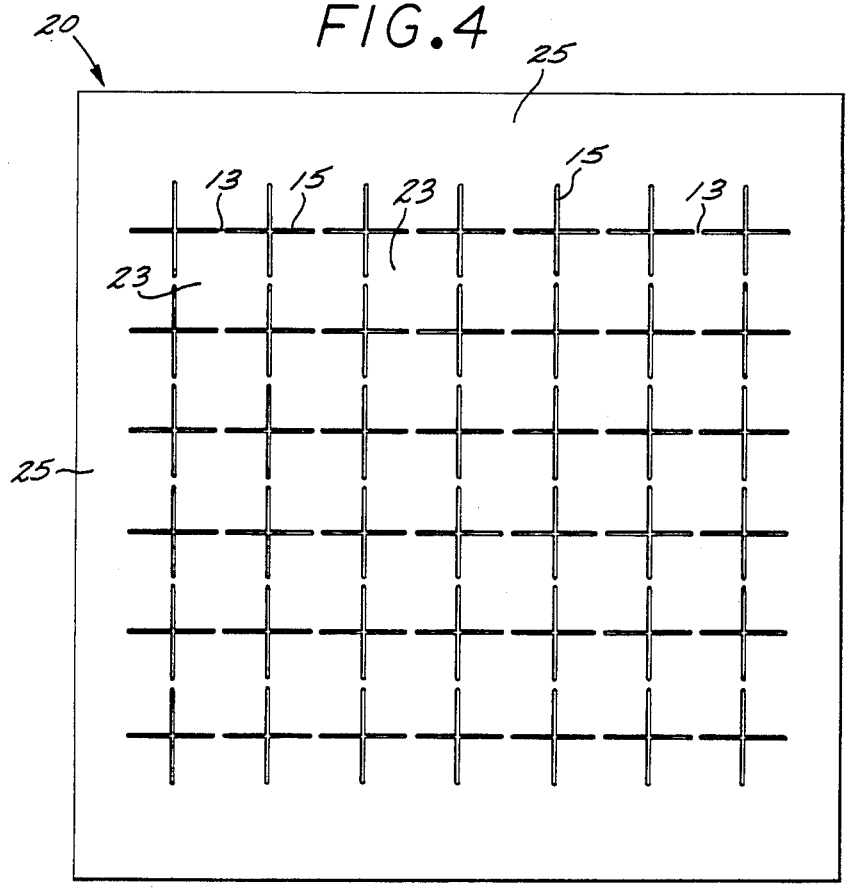
FIG. 4 is a schematic top plan view of the substrate of the chip carrier array of the invention.

The structure of the elongated slots 15 are more readily understood with reference to FIG. 4 which schematically shows the substrate 20 on which the chip carrier array 10 is formed. The ceramic substrate 20 includes chip carrier regions 23 which provide the substrates for the individual chip carriers 11. The chip carrier regions 23 are interconnected by the support bridges 13. Particularly, each side of each chip carrier region 23 is connected to another chip carrier region 23 or to a waste edge 25 by a support bridge 13 which is centrally located on such side.

The individual chip carrier regions 23 are separated from each other or from the waste edge 25 by the elongated slots 15 which extend from the support bridges 13. The elongated slots 15 extend beyond the corners of the chip carrier regions 23, which facilitates separation of the individual chip carriers 11. Thus, each elongated slot 15 intersects another elongated slot 15, and each such intersection defines a corner of one or more chip carrier regions 23.

The foregoing described chip carrier array 10 can be fabricated as follows. The planar ceramic substrate 20 is provided in an appropriate size. The chip carrier regions 23 are defined by forming the elongated slots 15 by laser cutting or other suitable process, thereby leaving the support bridges 13 so that the chip carrier regions 23 remain interconnected.

The edge interconnects 19 are then metallized. By way of example and with reference to FIG. 3, each edge interconnect 19 is formed by metallizing a top conductor 19a to wrap around from the top surface of a chip carrier 11 to part way down the side of the chip carrier 11. A bottom conductor 19b is then metallized to wrap around from the bottom surface to overlap the top conductor along the side of the chip carrier 11.

Figure 5:
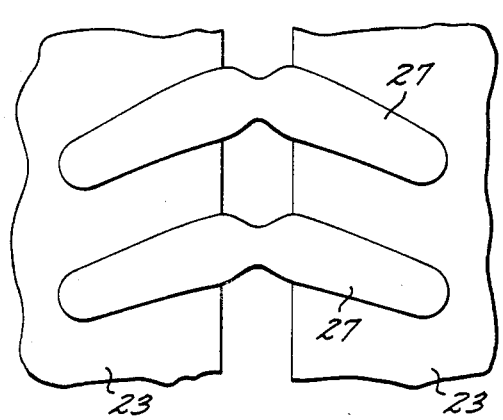
FIG. 5 is a top plan view illustrating the shared metallization for making the edge interconnects of the chip carrier of the invention.

Specifically, the top conductor portions 19a for all the chip carriers 11 of the chip carrier array 10 are applied by shared metallization wherein each pair of opposite top conductor portions 19a of adjacent chip carrier regions 23 are silk screen printed as single strips of metallization paste, as shown by the continuous metallization strips 27 in FIG. 5. Application of a vacuum to the bottom of the elongated slots 15 breaks each metallization strip 27 and causes the matallization paste to wrap around the edges of the chip carrier. The top conductor portions 19a so applied are then dried and sintered.

The bottom conductor portions 19b can also be formed by the above-described shared metallization process. The amount of overlap between the top conductor portions 19a and 19b is controlled by the shape of the silk screened metallization strips 27, the constituents of the conductive paste, and the viscosity of the conductive paste.

The wire bond interconnects 21 are metallized by silk screen printing, drying and sintering. As mentioned previously, the die pad 17 may be applied by known thick film metallization techniques.

After the foregoing metallization procedures, integrated circuit chips are mounted over the die pads 17, and wire bond connections are made between the intergrated circuit leads and the wire bond interconnects 21.

The chip carriers 11 are then separated from the array 10 by breaking the support bridges 13.

The foregoing described chip carrier array 10 provides significant advantages. As mentioned previously, the use of the elongated slots 15 to define the corners of the chip carriers 11 allows for easy and reliable separation.

The edge interconnects 19 can be formed using shared metallization and can be very closely spaced while maintaining electrical isolation between edge interconnects 19 of adjacent chip carriers 11. By way of example, 20 mil center to center spacing of the edge interconnects 19 has been achieved while maintaing electrical isolation. With known chip carrier arrays, electrical isolation could only be achieved by using larger holes or slits, which prevented close spacing of the edge interconnects.

The above described electrical isolation allows for testing of the chip carrier array 10 with mounted integrated circuit chips prior to separation of the array 10 into individual chip carriers 11. For example, a plurality of probes could be pressed into contact with the wrap around edge interconnects 19 on the bottom side of each chip carrier 11.

In addition to the above-described advantages of easy separation, shared metallization, and closer spacing of conductors, further advantages of the disclosed chip carrier array 10 include lower cost of production and les complexity in production. Further, the disclosed chip carrier array 10 is easier to inspect for defects.

A further feature of the disclosed invention is the chip carrier array substrate structure of FIG. 4 which may be readily provided as a product for use in making completed chip carriers.

Although the foregoing has been a description and illustration of specific embodiments of the invention, various modifications and changes thereto can be made by persons skilled in the art without departing from the scope and spirit of the invention as defined by the following claims.

What is claimed is:

1. A method of making a chip carrier array comprising the steps of:

providing a substrate; and forming elongated slots in the substrate which extend beyond the corners of individual chip carriers to define edges thereof and which form one severable interconnecting bridge at each edge of each chip carrier, each edge of each chip carrier including first and second edge portions separated by a respective interconnecting bridge, which bridges maintain the individual chip carriers in the chip carrier array.

2. The method of claim 1 further including the step of applying electrically isolated edge interconnects to the individual chip carriers which wrap around the chip carrier edges defined by the elongated slots.

3. The method of claim 2 wherein said step of applying edge interconnects to the individual chip carriers includes the steps of:

applying a plurality of pliable unitary conductors across each of the elongated slot portions that define each of the first and second edge portions; and applying a vacuum to pull the unitary conductors into the slots to break each of the unitary conductors into two electrically isolated conductors which wrap around respective first and second edge portions.

4. The method of claim 1 wherein said step of providing a substrate comprises the step of providing a planar substrate.

5. The method of claim 1 wherein said step of providing a substrate comprises the step of providing a ceramic substrate.

6. The method of claim 1 wherein said step of providing a substrate comprises the step of providing a planar ceramic substrate.

7. A method of making a chip carrier array comprising the steps of:

providing a substrate having first and second surfaces; and forming elongated slots in said substrate which define outer edges of individual rectangular chip carriers and which form one severable interconnecting bridge for each edge of each chip carrier, each edge of each chip carrier including first and second edge portions separated by a respective interconnecting bridge, which bridges maintain the individual chip carriers within the array;

applying a plurality of electrically isolated metallized edge interconnects to each of said first and second edge portions of each of said chip carriers which extend from the first surface thereof and wrap around the edges thereof to the second surface thereof.

8. The method of claim 7 wherein said step of providing a substrate comprises the step of providing a planar substrate.

9. The method of claim 8 wherein said step of applying said metallized edge interconnects comprises the steps of:

applying first pliable unitary conductors to the first surfaces of adjacent chip carriers adjacent to and extending across said elongated slots;

applying a vacuum to pull the first unitary conductors into the slots to break each of the unitary conductors into two electrically isolated conductors which wrap part way around the edges of said adjacent chip carriers;

applying second pliable unitary conductors to the second surfaces of adjacent chip carriers adjacent to and extending across said elongated slots; and applying a vacuum to pull the second unitary conductors into the slots to break each of the unitary conductors into two electrically isolated conductors which wrap part way around the edges of said adjacent chip carriers and contact predetermined ones of said first conductors.

10. The method of claim 7 wherein said step of providing a substrate comprises the step of providing a ceramic substrate.

11. The method of claim 10 wherein said step of applying said metallized edge interconnects comprises the steps of:

applying first pliable unitary conductors to the first surfaces of adjacent chip carriers adjacent to and extending across said elongated slots;

applying a vacuum to pull the first unitary conductors into the slots to break each of the unitary conductors into two electrically isolated conductors which wrap part way around the edges of said adjacent chip carriers;

applying second pliable unitary conductors to the second surfaces of adjacent chip carriers adjacent to and extending across said elongated slots; and applying a vacuum to pull the second unitary conductors into the slots to break each of the unitary conductors into two electrically isolated conductors which wrap part way around the edges of said adjacent chip carriers and contact predetermined ones of said first conductors.

12. The method of claim 17 wherein said step of providing a substrate comprises the step of providing a planar ceramic substrate.

13. The method of claim 12 wherein said step of applying said metallized edge interconnects comprises the steps of:

applying first pliable unitary conductors to the first surfaces of adjacent chip carriers adjacent to and extending across said elongated slots;

applying a vacuum to pull the first unitary conductors into the slots to break each of the unitary conductors into two electrically isolated conductors which wrap part way around the edges of said adjacent chip carriers;

applying second pliable unitary conductors to the second surfaces of adjacent ship carriers adjacent to and extending across said elongated slots; and applying a vacuum to pull the second unitary conductors into the slots to break each of the unitary conductors into two electrically isolated conductors which wrap part way around the edges of said adjacent chip carriers and contact predetermined ones of said first conductors.

14. The method of claim 7 wherein said step of applying said metallized edge interconnects comprises the steps of:

applying first pliable unitary conductors to the first surfaces of adjacent chip carriers adjacent to and extending across said elongated slots;

applying a vacuum to pull the first unitary conductors into the slots to break each of the unitary conductors into two electrically isolated conductors which wrap part way around the edges of said adjacent chip carriers;

applying second pliable unitary conductors to the second surfaces of adjacent chip carriers adjacent to and extending across said elongated slots; and applying a vacuum to pull the second unitary conductors into the slots to break each of the unitary conductors into two electrically isolated conductors which wrap part way around the edge of said adjacent chip carriers and contact predetermined ones of said first conductors.

15. A method of making a chip carrier array comprising the steps of:

providing a substrate; and forming a plurality of individual chip carriers in said substrate having outer edges and carriers defined by elongated slots which extend from single severable interconnecting bridges respectively located along each edge of each carrier and separating each chip carrier edge into first and second edge portions, which bridges maintain the individual chip carriers within the array; and forming metallized edge interconnects on each of said plurality of chip carriers.

16. A method of making a chip carrier array comprising the steps of:

providing a substrate;

forming a plurality of individual chip carriers in said substrate having top and bottom surfaces and having outer edges and corners defined by elongated slots which extend from single severable interconnecting bridges respectively located along each edge of each carrier and separating each chip carrier edge into first and second edge portions, which bridges maintain the individual chip carriers within said array;

forming a first portion of overlapping electrically isolated metallized edge interconnects which comprises a first metallization pattern which extends from the top surfaces of said chip carriers and wraps around the edges formed by said elongated slots and extends a predetermined distance across said edges; and forming a second portion of said electrically isolated metallized edge interconnects which comprises a second metallization pattern which extends from the bottom surfaces of said chip carriers and wraps around the edges formed by said elongated slots and overlaps said first metallization pattern to form a continuous electrically isolated edge metallization pattern which wraps around the edges of said chip carriers.

17. The method of claim 16 wherein said step of providing a substrate comprises the step of providing a planar substrate.

18. The method of claim 16 wherein said step of providing a substrate comprises the step of providing a ceramic substrate.

19. The method of claim 16 wherein said step of providing a substrate comprises the step of providing a planar ceramic substrate.

20. A method of mounting electronic chips on interconnected individual chip carriers to form interconnected mounted chip carrier assemblies, and electrically testing the interconnected mounted chip carrier assemblies, said method comprising the steps of:

providing a chip carrier array comprising a plurality of chip carriers having top and bottom surfaces and having outer edges defined by slots extending from single severable interconnecting bridges respectively located along each edge of each carrier and separating each chip carrier edge into first and second edge portions, which bridges maintain the chip carriers within the array;

providing a plurality of electrically isolated metallized edge interconnects which wrap around the edges and portions of the top and bottom surfaces adjacent the edges;

disposing a plurality of electronic chips on said plurality of individual chip carriers; and electrically coupling said electronic chips to selected ones of said metallized edge interconnects to form mounted carrier assemblies;

electrically testing said mounted carrier assemblies for electrical performance.

21. A method of mounting electronic chips on interconnected individual chip carriers to form interconnected mounted chip carrier assemblies and electrically testing the interconnected mounted chip carrier assemblies, said method comprising the steps of:

providing a chip carrier array comprising a plurality of chip carriers having top and bottom surfaces and having outer edges defined by slots extending from single severable interconnecting bridges respectively located along each edge of each carrier and separating each chip carrier edge into first and second edge portions, which bridges which maintain the chip carriers within the array;

providing a plurality of electrically isolated metallized edge interconnects which wrap around the edges and portions of the top and bottom surfaces adjacent the edges;

disposing a plurality of electronic chips on said plurality of individual chip carriers;

electrically coupling said electronic chips to selected ones of said metallized edge interconnects to form mounted carrier assemblies;

electrically testing said mounted carrier assemblies for electrical performance; and severing said bridges to physically separate said mounted carrier assemblies from one another.

* * * * *